(12) United States Patent
Hsu

(10) Patent No.: US 10,420,236 B1
(45) Date of Patent: Sep. 17, 2019

(54) USB QUICK CONNECTOR

(71) Applicant: Dong Guan Jia Sheng Lighting Technology Co., Ltd. China, Dong-Guna, Guang-Dong (CN)

(72) Inventor: Kevin Hsu, Taichung (TW)

(73) Assignee: Dong Guan Jia Sheng Lighting Technology Co., Ltd. China, Guang-Dong (CN)

( * ) Notice: Subject to any disclaimer, the term of this patent is extended or adjusted under 35 U.S.C. 154(b) by 0 days.

(21) Appl. No.: 16/232,236

(22) Filed: Dec. 26, 2018

(51) Int. Cl.
*H05K 5/02* (2006.01)
*G06F 13/38* (2006.01)
*H02J 7/00* (2006.01)
*H01R 13/52* (2006.01)
*H01M 10/42* (2006.01)

(52) U.S. Cl.
CPC ......... *H05K 5/0278* (2013.01); *G06F 13/382* (2013.01); *H01M 10/4257* (2013.01); *H01R 13/521* (2013.01); *H01R 13/5219* (2013.01); *H02J 7/0042* (2013.01); *H02J 7/0052* (2013.01); *H02J 2007/0062* (2013.01)

(58) Field of Classification Search
CPC .... H05K 5/0278; H05K 5/061; H05K 5/0221; H02J 7/0052; H02J 7/0042; H02J 2007/0062; H01M 10/4257; G06F 13/382; G06F 1/1656; G06F 1/1626; G06F 1/1613; G06F 2200/1633; G06F 1/1679; H01R 13/447; H01R 13/5213; H01R 13/5202; H01R 13/5219; H01R 13/521
See application file for complete search history.

(56) References Cited

U.S. PATENT DOCUMENTS

| | | | | | |
|---|---|---|---|---|---|
| 5,701,355 | A | * | 12/1997 | Brannan | H04R 1/08 174/653 |
| 6,183,292 | B1 | * | 2/2001 | Chen | H01R 13/6594 439/541.5 |
| 6,835,092 | B2 | * | 12/2004 | Wan | H01R 13/6658 439/541.5 |
| 7,184,273 | B2 | * | 2/2007 | Sakai | H05K 5/0039 361/728 |
| 7,789,437 | B2 | * | 9/2010 | Sheng | G06F 1/1658 292/137 |
| 7,985,091 | B1 | * | 7/2011 | Fu | H01R 31/06 439/345 |
| 9,668,370 | B1 | * | 5/2017 | Huang | G06F 1/1656 |

(Continued)

*Primary Examiner* — Dimary S Lopez Cruz
*Assistant Examiner* — Abhishek M Rathod
(74) *Attorney, Agent, or Firm* — Alan D. Kamrath; Mayer & Williams PC

(57) ABSTRACT

A USB quick connector includes a housing, a rechargeable battery mounted in the housing, a circuit board mounted in the housing, and a plug connected with the housing. The circuit board is provided with two USB ports. The housing includes a first cover, a second cover combined with the first cover, a side plate mounted on and covers the first cover and the second cover, a first waterproof gasket mounted on and surrounding the USB ports of the circuit board, and a second waterproof gasket located between and surrounding the first cover and the second cover. A receiving space is formed between the first cover and the second cover. The rechargeable battery and the circuit board are arranged in the receiving space.

9 Claims, 5 Drawing Sheets

(56) References Cited

U.S. PATENT DOCUMENTS

| | | | |
|---|---|---|---|
| 2009/0253027 A1* | 10/2009 | Yang | H01M 2/1072 |
| | | | 429/61 |
| 2012/0108088 A1* | 5/2012 | Peng | H01R 13/5213 |
| | | | 439/135 |
| 2014/0085784 A1* | 3/2014 | Lee | H05K 5/0221 |
| | | | 361/679.01 |
| 2014/0104795 A1* | 4/2014 | Wee | H05K 7/14 |
| | | | 361/752 |

* cited by examiner

US 10,420,236 B1

USB QUICK CONNECTOR

BACKGROUND OF THE INVENTION

1. Field of the Invention

The present invention relates to a connector for an electronic appliance and, more particularly, to a USB quick connector.

2. Description of the Related Art

A conventional USB quick connector comprises a plurality of USB ports to provide a data transmission or charging function to an electronic appliance. However, the conventional USB quick connector does not have a waterproof function, such that water easily enters the USB ports, thereby causing an electric leakage, and thereby damaging and shortening the lifetime of the electronic appliance.

BRIEF SUMMARY OF THE INVENTION

The primary objective of the present invention is to provide a USB quick connector with a waterproof function. In accordance with the present invention, there is provided a USB quick connector comprising a housing, a rechargeable battery mounted in the housing, a circuit board mounted in the housing, and a plug connected with the housing and having a first end extending into the housing and a second end extending outward from the housing. The circuit board is provided with two USB ports. The housing includes a first cover, a second cover combined with the first cover, a side plate mounted on and covers the first cover and the second cover, a first waterproof gasket mounted on and surrounding the USB ports of the circuit board, and a second waterproof gasket located between and surrounding the first cover and the second cover. A receiving space is formed between the first cover and the second cover. The rechargeable battery and the circuit board are arranged in the receiving space.

According to the primary advantage of the present invention, the first waterproof gasket provides a waterproof function to the USB ports of the circuit board so as to protect and prevent the water from entering the USB ports of the circuit board.

According to another advantage of the present invention, the second waterproof gasket is located between the first cover and the second cover to prevent the water from entering the clearance between the first cover and the second cover.

Further benefits and advantages of the present invention will become apparent after a careful reading of the detailed description with appropriate reference to the accompanying drawings.

BRIEF DESCRIPTION OF THE SEVERAL VIEWS OF THE DRAWING(S)

DETAILED DESCRIPTION OF THE INVENTION

Figure 1:
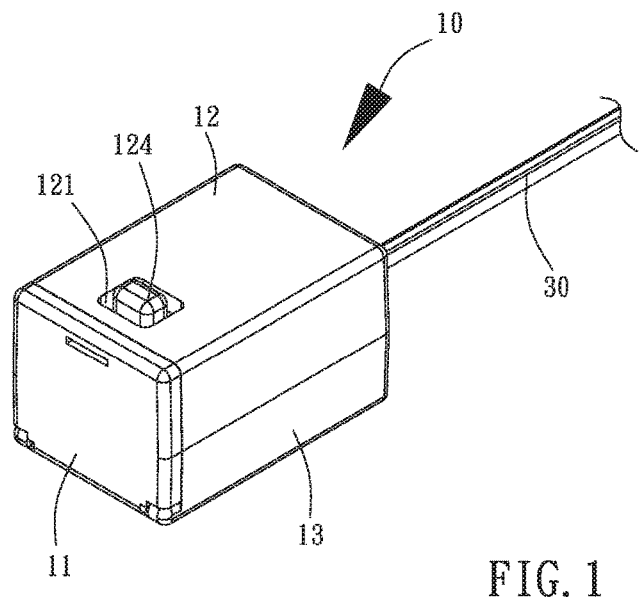
FIG. 1 is a perspective view of a USB quick connector in accordance with the preferred embodiment of the present invention.
Figure 2:
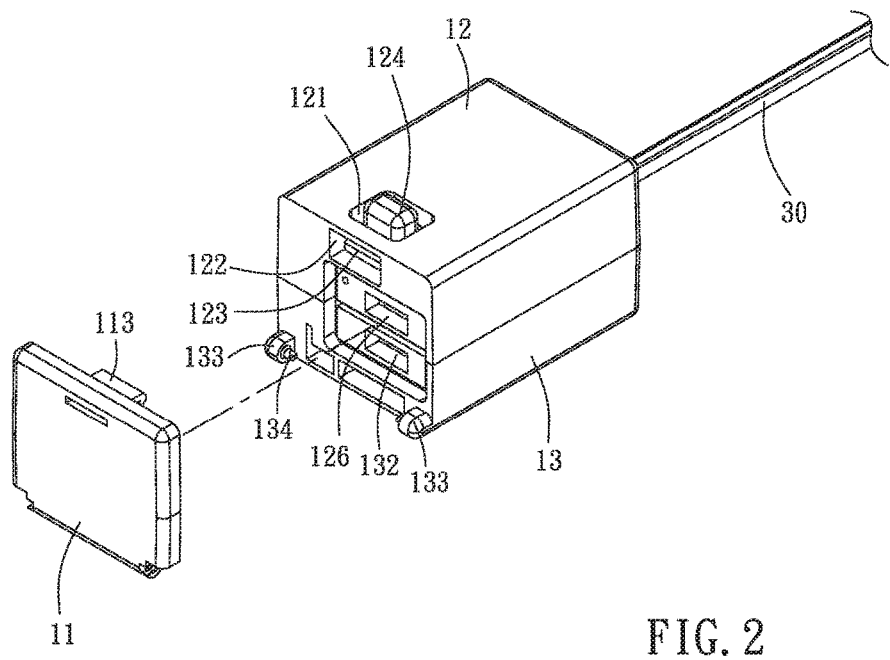
FIG. 2 is a partial exploded perspective view of the USB quick connector in accordance with the preferred embodiment of the present invention.
Figure 3:
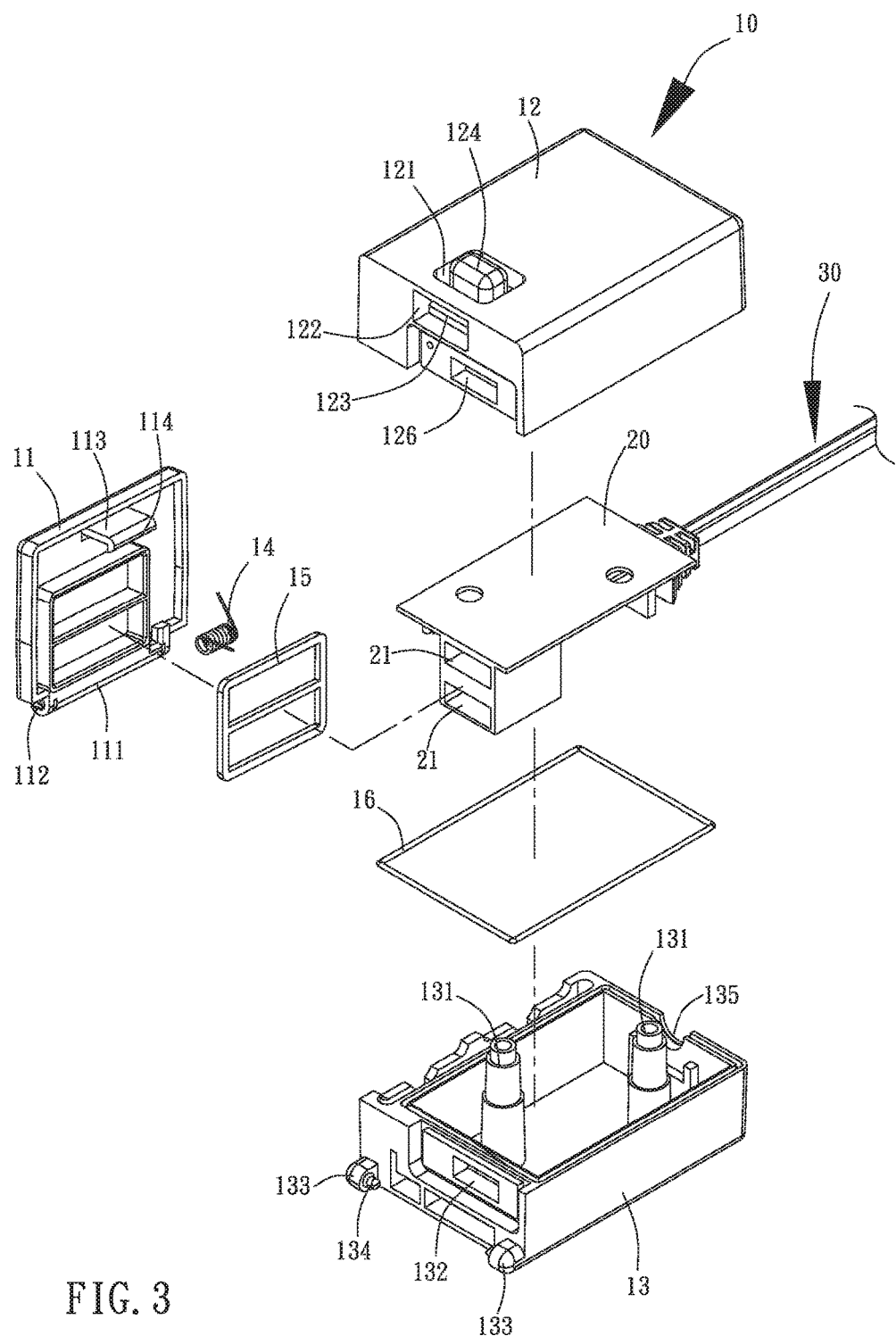
FIG. 3 is an exploded perspective view of the USB quick connector in accordance with the preferred embodiment of the present invention.
Figure 4:
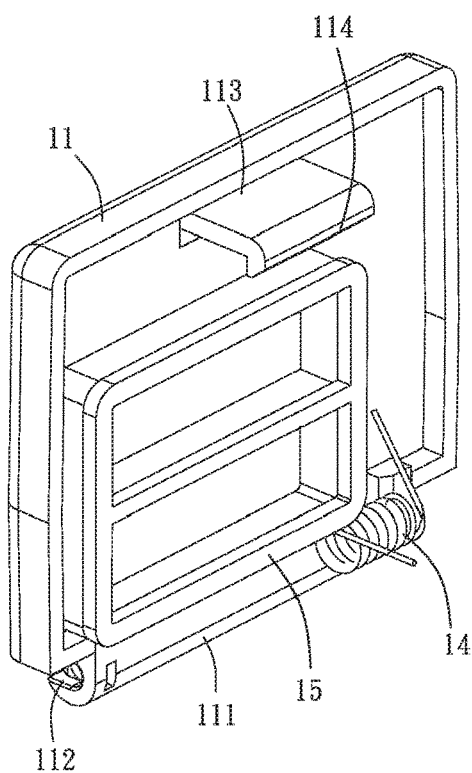
FIG. 4 is a perspective view of a side plate of the USB quick connector in accordance with the preferred embodiment of the present invention.
Figure 5:
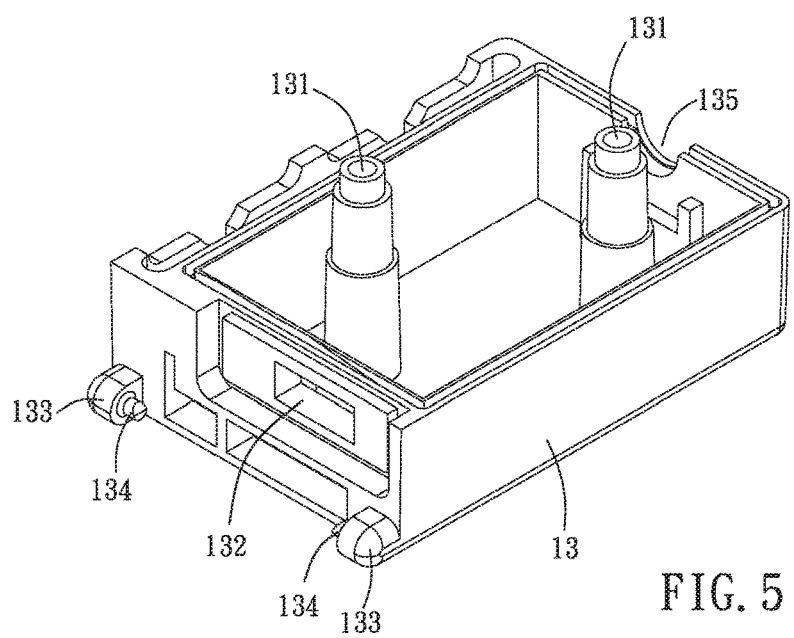
FIG. 5 is a perspective view of a second cover of the USB quick connector in accordance with the preferred embodiment of the present invention.
Figure 6:
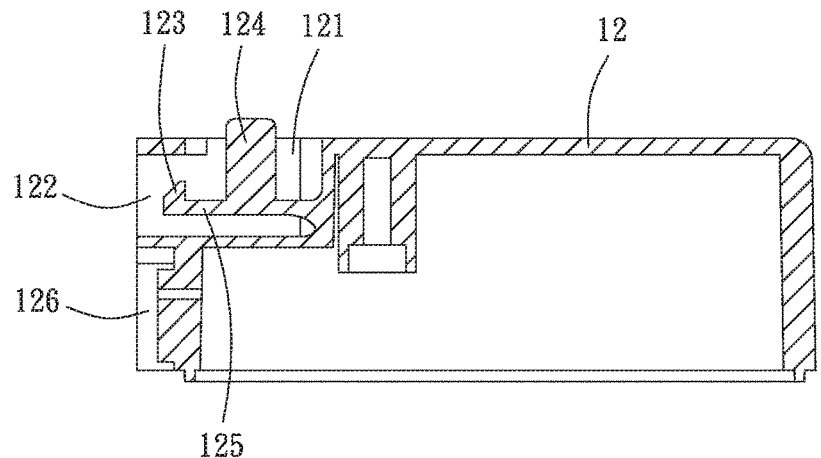
FIG. 6 is a cross-sectional view of a first cover of the USB quick connector in accordance with the preferred embodiment of the present invention.
Figure 7:
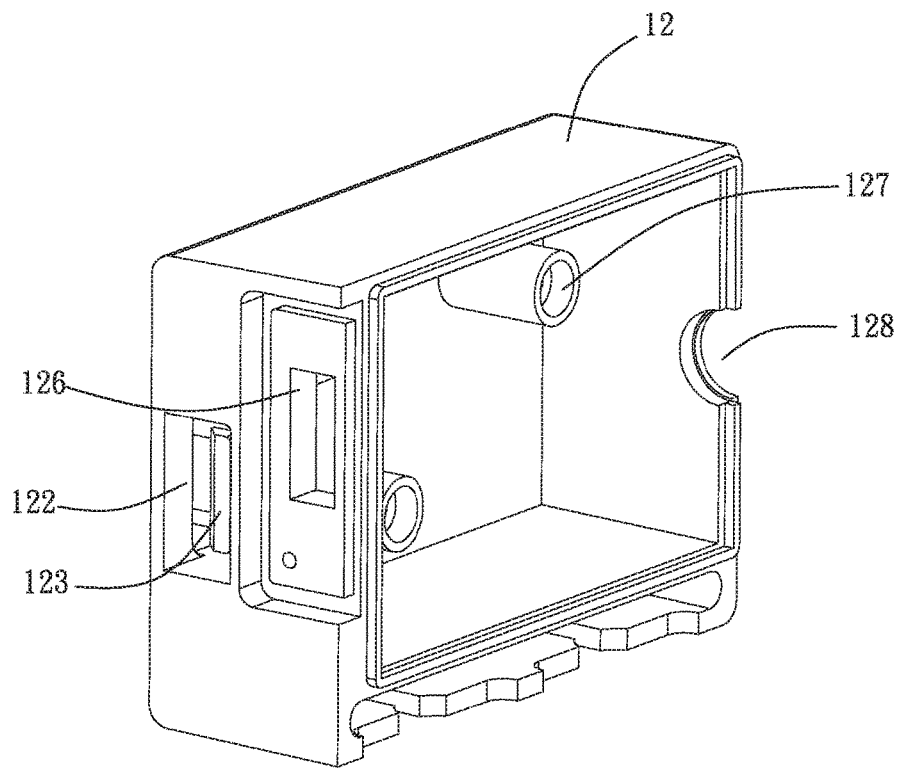
FIG. 7 is a perspective view of the first cover of the USB quick connector in accordance with the preferred embodiment of the present invention.

Referring to the drawings and initially to FIGS. 1-8, a USB quick connector in accordance with the preferred embodiment of the present invention comprises a housing 10, a rechargeable battery mounted in the housing 10, a circuit board 20 mounted in the housing 10, and a plug 30 connected with the housing 10 and having a first end extending into the housing 10 and a second end extending outward from the housing 10. The plug 30 is electrically connected with an external power supply to provide an electric power to the circuit board 20 and to charge the rechargeable battery.

The circuit board 20 is provided with two USB ports 21. The housing 10 includes a first cover 12, a second cover 13 combined with the first cover 12, a side plate 11 mounted on and covers the first cover 12 and the second cover 13 to achieve a waterproof purpose, a first waterproof gasket 15 mounted on and surrounding the USB ports 21 of the circuit board 20 to prevent the water from entering the side plate 11 and the USB ports 21 of the circuit board 20, and a second waterproof gasket 16 located between and surrounding the first cover 12 and the second cover 13 to prevent the water from entering the clearance between the first cover 12 and the second cover 13. A receiving space 17 is formed between and defined by the first cover 12 and the second cover 13. The rechargeable battery and the circuit board 20 are arranged in the receiving space 17. The side plate 11 is located opposite to the plug 30. The side plate 11 is located adjacent to the USB ports 21 of the circuit board 20.

In the preferred embodiment of the present invention, the first cover 12 is provided with a first slot 121 located opposite to the second cover 13, and a second slot 122 located opposite to the plug 30. The second slot 122 of the first cover 12 extends transversely and is connected to the first slot 121.

In the preferred embodiment of the present invention, the first cover 12 is provided with a transverse plate 125 which has a distal end provided with a first projection 123 which extends into the second slot 122. The transverse plate 125 is flexible and has a middle provided with a second projection 124 which extends into and protrudes outward from the first slot 121 to facilitate a user pressing the second projection 124. The side plate 11 has a top provided with a connecting portion 113 which has a distal end provided with a locking protrusion 114 locked onto the first projection 123 of the first cover 12.

In the preferred embodiment of the present invention, the first cover 12 has a first side provided with a first window 126 and a second side provided with a first opening 128. The first window 126 is located opposite to the plug 30, and the first opening 128 is located adjacent to the plug 30.

In the preferred embodiment of the present invention, the first cover 12 has an interior provided with a plurality of first hollow columns 127, and the second cover 13 has an interior provided with a plurality of second hollow columns 131 juxtaposed to the first hollow columns 127 of the first cover 12. The housing 10 further includes a plurality of threaded rods screwed through the first hollow columns 127 of the first cover 12 and the second hollow columns 131 of the second cover 13. Preferably, each of the first hollow columns 127 of the first cover 12 is provided with a first threaded hole screwed onto each of the threaded rods, and each of the second hollow columns 131 of the second cover 13 is provided with a second threaded hole screwed onto each of the threaded rods.

In the preferred embodiment of the present invention, the second cover 13 has a first side provided with a second window 132 and a second side provided with a second opening 135. The second window 132 is located opposite to the plug 30, and the second opening 135 is located adjacent to the plug 30. The first window 126 of the first cover 12 and the second window 132 the second cover 13 align with the two USB ports 21 of the circuit board 20 respectively.

In the preferred embodiment of the present invention, the first opening 128 of the first cover 12 and the second opening 135 of the second cover 13 are connected and form a connecting hole.

In the preferred embodiment of the present invention, the first side of the second cover 13 is provided with two protruding ears 133. Each of the two protruding ears 133 is provided with a stub 134 which is arranged transversely. The side plate 11 has a bottom provided with a protruding shaft 111 which has two ends each provided with a limit groove 112 mounted on the stub 134 of each of the two protruding ears 133, such that the protruding shaft 111 is pivotally mounted between the two protruding ears 133.

In the preferred embodiment of the present invention, the housing 10 further includes a spring 14 biased between the side plate 11 and the second cover 13. The spring 14 has a first end secured on the bottom of the side plate 11 and a second end secured on the bottom of the second cover 13. Thus, when the side plate 11 is unlocked from the first cover 12, the side plate 11 is automatically removed from the first cover 12 by the restoring force of the spring 14.

In the preferred embodiment of the present invention, the first end of the plug 30 is electrically connected with the rechargeable battery and the circuit board 20, and the second end of the plug 30 extends through and protrudes outward from the connecting hole of the housing 10.

In assembly, the rechargeable battery, the circuit board 20 and the plug 30 are arranged in the second cover 13. Then, the limit groove 112 of the protruding shaft 111 is mounted on the stub 134 of each of the two protruding ears 133, such that the protruding shaft 111 is pivotally mounted between the two protruding ears 133, with the spring 14 being biased between the side plate 11 and the second cover 13. Then, the second waterproof gasket 16 is located between and surrounding the first cover 12 and the second cover 13. Then, the first cover 12 is mounted on the second cover 13, with the second hollow columns 131 of the second cover 13 being juxtaposed to the first hollow columns 127 of the first cover 12. At this time, the plug 30 extends through and protrudes outward from the connecting hole (defined by the first opening 128 of the first cover 12 and the second opening 135 of the second cover 13) of the housing 10. Then, the threaded rods are screwed through the first hollow columns 127 of the first cover 12 and the second hollow columns 131 of the second cover 13 to combine the first cover 12 and the second cover 13 together. Then, the first waterproof gasket 15 is mounted on the USB ports 21 of the circuit board 20. Then, the locking protrusion 114 of the side plate 11 is locked onto the first projection 123 of the first cover 12. Finally, the plug 30 is electrically connected with the external power supply.

Figure 8:
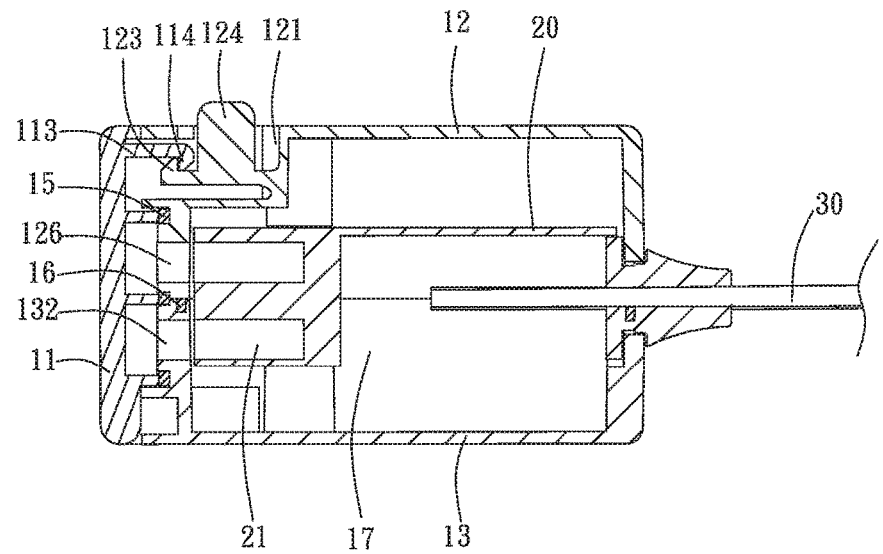
FIG. 8 is a cross-sectional view of the USB quick connector in accordance with the preferred embodiment of the present invention.
Figure 9:
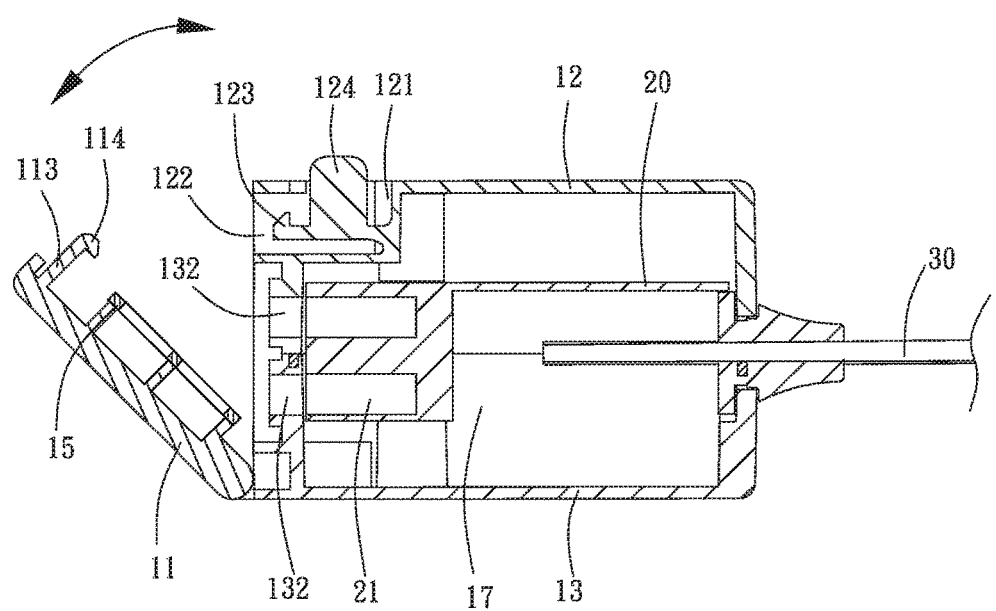
FIG. 9 is a schematic operational view of the USB quick connector as shown in FIG. 8 in use.

In operation, referring to FIGS. 8 and 9 with reference to FIGS. 1-7, the locking protrusion 114 of the side plate 11 is initially locked onto the first projection 123 of the first cover 12 as shown in FIG. 8, such that the side plate 11 is affixed to the first cover 12. When the second projection 124 of the first cover 12 is pressed, the transverse plate 125 is flexed and moved downward, and the first projection 123 of the first cover 12 is moved downward and detached from the locking protrusion 114 of the side plate 11, such that the side plate 11 is unlocked from the first cover 12. When the side plate 11 is unlocked from the first cover 12, the side plate 11 is pushed by the restoring force of the spring 14 and is automatically pivoted outward relative to and removed from the first cover 12 as shown in FIG. 9. In such a manner, the USB ports 21 of the circuit board 20 are used by the user to charge or provide the electric power to an electronic appliance. After the charging process is finished, the side plate 11 is pushed toward the first cover 12, such that the locking protrusion 114 of the side plate 11 is locked onto the first projection 123 of the first cover 12, so as to lock the side plate 11 onto the first cover 12 again.

Accordingly, the first waterproof gasket 15 provides a waterproof function to the USB ports 21 of the circuit board 20 so as to protect and prevent the water from entering the USB ports 21 of the circuit board 20. In addition, the second waterproof gasket 16 is located between the first cover 12 and the second cover 13 to prevent the water from entering the clearance between the first cover 12 and the second cover 13. Further, the housing 10 protects the rechargeable battery, the circuit board 20 and the plug 30.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the scope of the invention.

The invention claimed is:

1. A USB (Universal Serial Bus) quick connector comprising:
   a housing;
   a circuit board mounted in the housing; and
   a plug connected with the housing and having a first end extending into the housing and a second end extending outward from the housing;
   wherein:
   the circuit board is provided with two USB ports;
   the housing includes a first cover, a second cover combined with the first cover, a side plate mounted on and covers the first cover and the second cover,
   wherein the first cover includes first slot, a second slot, and a transverse pate, wherein the transverse plate has a distal end provided with a first projection which extends into the second slot; the transverse plate is provided with a second projection which extends into and protrudes outward from the first slot;

wherein the side plate is provided with a connecting portion which has a distal end provided with a locking protrusion locked onto the first projection of the first cover, when the side plate is mounted on and covers the first cover, a first waterproof gasket mounted on and surrounding the USB ports of the circuit board, and a second waterproof gasket located between and surrounding the first cover and the second cover;

a receiving space is formed between the first cover and the second cover; and the circuit board are arranged in the receiving space.

2. The USB quick connector of claim 1, wherein:
the second slot of the first cover extends transversely and is connected to the first slot.

3. The USB quick connector of claim 1, wherein the first cover has a first side provided with a first window and a second side provided with a first opening.

4. The USB quick connector of claim 3, wherein:
the first cover has an interior provided with a plurality of first hollow columns;
the second cover has an interior provided with a plurality of second hollow columns juxtaposed to the first hollow columns of the first cover;
the housing further includes a plurality of threaded rods screwed through the first hollow columns of the first cover and the second hollow columns of the second cover;
each of the first hollow columns of the first cover is provided with a first threaded hole screwed onto each of the threaded rods; and
each of the second hollow columns of the second cover is provided with a second threaded hole screwed onto each of the threaded rods.

5. The USB quick connector of claim 4, wherein:
the second cover has a first side provided with a second window and a second side provided with a second opening; and
the first window of the first cover and the second window the second cover align with the two USB ports of the circuit board respectively.

6. The USB quick connector of claim 5, wherein the first opening of the first cover and the second opening of the second cover are connected and form a connecting hole.

7. The USB quick connector of claim 1, wherein:
the first side of the second cover is provided with two protruding ears;
each of the two protruding ears is provided with a stub which is arranged transversely; and
the side plate is provided with a protruding shaft which has two ends each provided with a limit groove mounted on the stub of each of the two protruding ears, such that the protruding shaft is pivotally mounted between the two protruding ears.

8. The USB quick connector of claim 1, wherein:
the housing further includes a spring biased between the side plate and the second cover; and
the spring has a first end secured on the side plate and a second end secured on the second cover.

9. The USB quick connector of claim 6,
wherein the first end of the plug is electrically connected with the circuit board, and
the second end of the plug extends through and protrudes outward from the connecting hole of the housing.

* * * * *